United States Patent
Horiguchi et al.

(10) Patent No.: US 9,464,924 B2
(45) Date of Patent: Oct. 11, 2016

(54) SCALE, DISPLACEMENT DETECTION APPARATUS, LENS APPARATUS, IMAGE PICKUP SYSTEM, AND ASSEMBLING APPARATUS

(71) Applicant: CANON KABUSHIKI KAISHA, Tokyo (JP)

(72) Inventors: Haruhiko Horiguchi, Tokyo (JP); Chihiro Nagura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 333 days.

(21) Appl. No.: 14/138,850

(22) Filed: Dec. 23, 2013

(65) Prior Publication Data

US 2014/0184202 A1  Jul. 3, 2014

(30) Foreign Application Priority Data

Dec. 28, 2012  (JP) ................. 2012-286465

(51) Int. Cl.
| | | |
|---|---|---|
| *H01L 27/00* | (2006.01) | |
| *G01D 5/347* | (2006.01) | |
| *G01B 7/00* | (2006.01) | |
| *H01L 27/146* | (2006.01) | |
| *G01D 5/244* | (2006.01) | |

(52) U.S. Cl.
CPC ........... *G01D 5/34776* (2013.01); *G01B 7/003* (2013.01); *G01D 5/24438* (2013.01); *G01D 5/34792* (2013.01); *H01L 27/14625* (2013.01)

(58) Field of Classification Search
CPC .............. G01D 5/34776; G01D 5/347; H01L 27/14625
See application file for complete search history.

(56) References Cited

U.S. PATENT DOCUMENTS

| | | | |
|---|---|---|---|
| 5,096,044 A | 3/1992 | Biebel | |
| 7,687,765 B2 | 3/2010 | Sugiyama et al. | |
| 9,127,967 B2 * | 9/2015 | Nagura .............. | G01D 5/34746 |
| 2010/0102804 A1 | 4/2010 | Burkhardt et al. | |

FOREIGN PATENT DOCUMENTS

| | | |
|---|---|---|
| EP | 0 421 164 A1 | 4/1991 |
| EP | 2 511 668 A2 | 10/2012 |
| JP | 2003-021542 A | 1/2003 |
| JP | 3473148 B2 | 2/2003 |
| JP | 4360762 B2 | 11/2009 |

OTHER PUBLICATIONS

Extended European Search Report for corresponding EP 13199115. 0, mail date Jun. 13, 2014.

* cited by examiner

*Primary Examiner* — Tony Ko

(74) *Attorney, Agent, or Firm* — Rossi, Kimms & McDowell LLP

(57) ABSTRACT

A scale is used in a displacement detection apparatus (100) which detects a position of an object, the scale includes a pattern periodically formed in a measurement direction (an X direction), and the pattern is configured so as to change a physical property in a direction (a Y direction) perpendicular to the measurement direction without changing phase information in the measurement direction when a detector reading the pattern moves relative to the pattern in the direction perpendicular to the measurement direction.

15 Claims, 13 Drawing Sheets

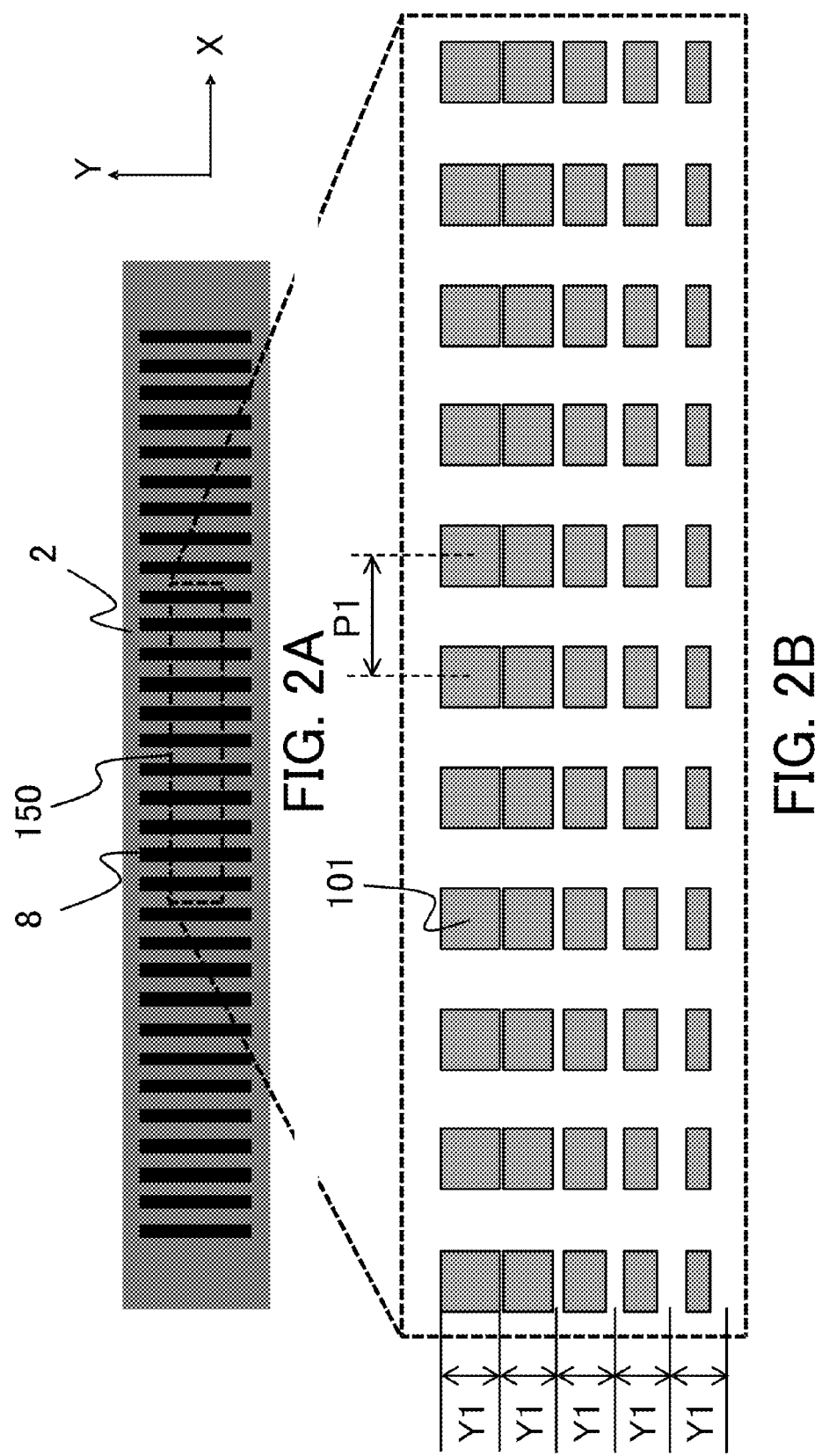

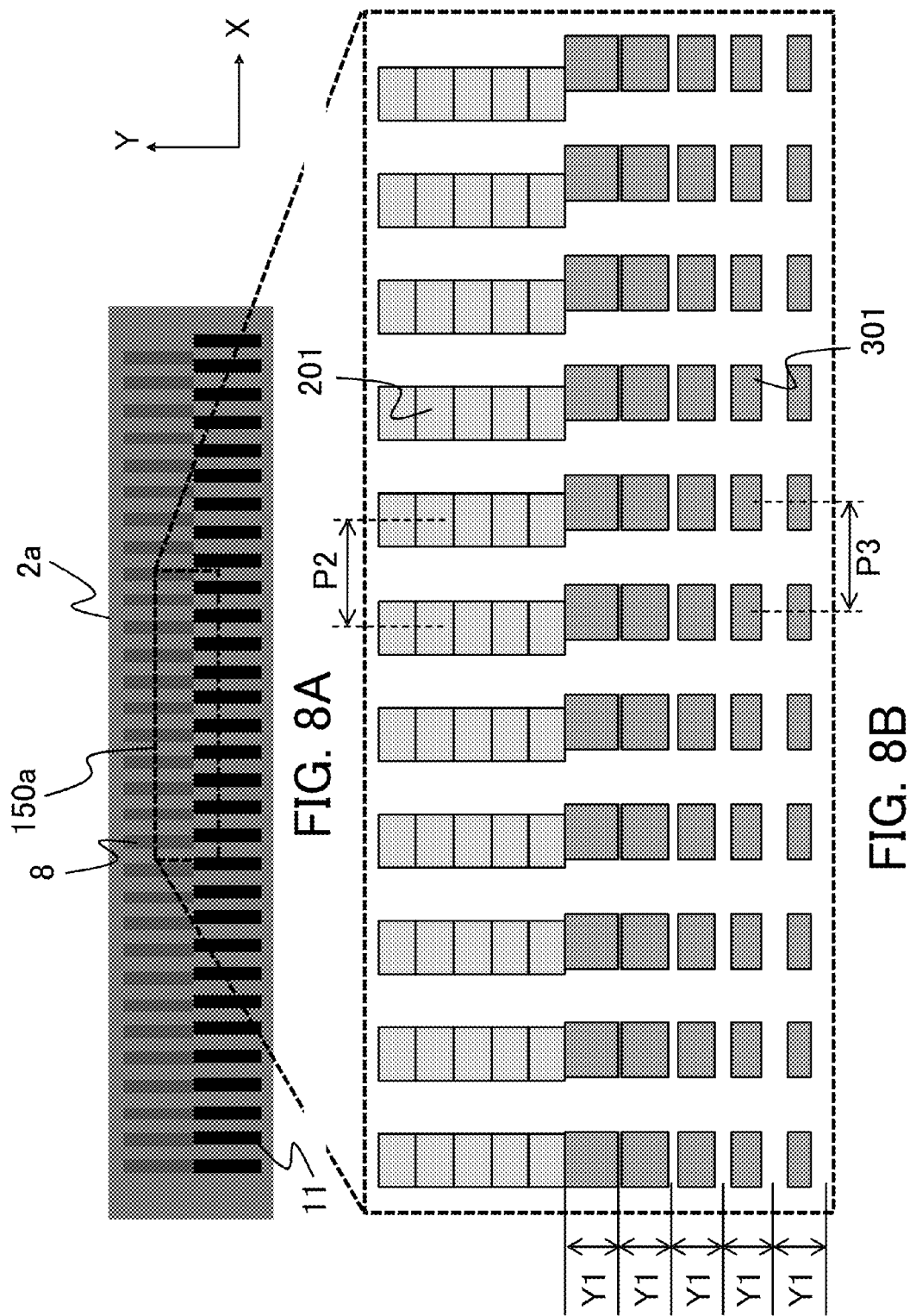

SCALE, DISPLACEMENT DETECTION APPARATUS, LENS APPARATUS, IMAGE PICKUP SYSTEM, AND ASSEMBLING APPARATUS

BACKGROUND OF THE INVENTION

1. Field of the Invention

The present invention relates to a scale used for a displacement detection apparatus that detects a position of an object.

2. Description of the Related Art

Previously, as a unit of detecting a moving amount or a rotating amount of an object (an object to be measured), a displacement detection apparatus has been known. In addition, as the displacement detection apparatus, there is an optical-type, magnetic-type, or capacitance-type displacement detection apparatus, or the like. For example, the optical-type displacement detection apparatus is configured by including a light source, a scale that reflects or transmits light emitted from the light source to be able to be displaced relative to the light source, and a light receiving element that receives light reflected by or transmitting through the scale. A pattern that reflects or transmits light is formed on the optical scale, and a light amount received by the light receiving element changes depending on a relative displacement of the scale. The displacement is detected based on a detection signal generated by the change of the light amount by the light receiving element.

Japanese Patent No. 4360762 relates to a displacement detection apparatus, which discloses a configuration in which a light amount passing through an opening is detected to detect a relative alignment between a light receiving portion and a scale of the displacement detection apparatus. Japanese Patent No. 3473148 discloses a configuration in which a transit time of a wedge-shaped pattern is measured to detect a relative alignment between a sensor and a scale.

However, when an inexpensive light source such as an LED or an LD is used in the displacement detection apparatus disclosed in Japanese Patent No. 4360762, a lens for shaping a light beam is necessary. In the configuration disclosed in Japanese Patent No. 4360762, it is possible to detect a displacement from an optimum alignment state, but a direction of the displacement cannot be detected. In this configuration, in order to determine the direction of the displacement, further alight shielding member, a dedicated light receiving portion, or the like needs to be prepared. In the configuration disclosed in Japanese Patent No. 3473148, when the scale is displaced relative to the sensor in a direction perpendicular to a measurement direction, phase information of the measurement direction is influenced.

SUMMARY OF THE INVENTION

The present invention provides small-sized and highly-accurate scale, displacement detection apparatus, lens apparatus, image pickup system, and assembling apparatus at low cost.

A scale as one aspect of the present invention is a scale which is to be used in a displacement detection apparatus detecting a position of an object, the scale includes a pattern periodically formed in a measurement direction, and the pattern is configured so as to change a physical property in a direction perpendicular to the measurement direction without changing phase information in the measurement direction when a detector reading the pattern moves relative to the pattern in the direction perpendicular to the measurement direction.

A displacement detection apparatus as another aspect of the present invention is a displacement detection apparatus which detects a position of an object, the displacement detection apparatus includes a scale having a pattern periodically formed in a measurement direction, a detector configured to be movable relative to the scale, and a signal processor configured to process an output signal of the detector to obtain position information of the object, and the pattern is configured so as to change a physical property in a direction perpendicular to the measurement direction without changing phase information in the measurement direction when the scale and the detector moves relative to each other in the direction perpendicular to the measurement direction.

A lens apparatus as another aspect of the present invention includes a lens capable of being displaced in an optical axis direction, and the displacement detection apparatus configured to detect a displacement of the lens.

An image pickup system as another aspect of the present invention includes the lens apparatus, and an image pickup apparatus including an image pickup element configured to perform a photoelectric conversion of an optical image via the lens.

An assembling apparatus as another aspect of the present invention includes an assembling unit including a robot arm and a conveyer configured to convey an object to be assembled, and a displacement detection apparatus configured to detect a position of the conveyer.

Further features and aspects of the present invention will become apparent from the following description of exemplary embodiments with reference to the attached drawings.

BRIEF DESCRIPTION OF THE DRAWINGS

FIGS. 2A and 2B are configuration diagrams of a scale in the first embodiment.

FIGS. 8A and 8B are configuration diagrams of a scale in the second embodiment.

DESCRIPTION OF THE EMBODIMENTS

Figure 1A:
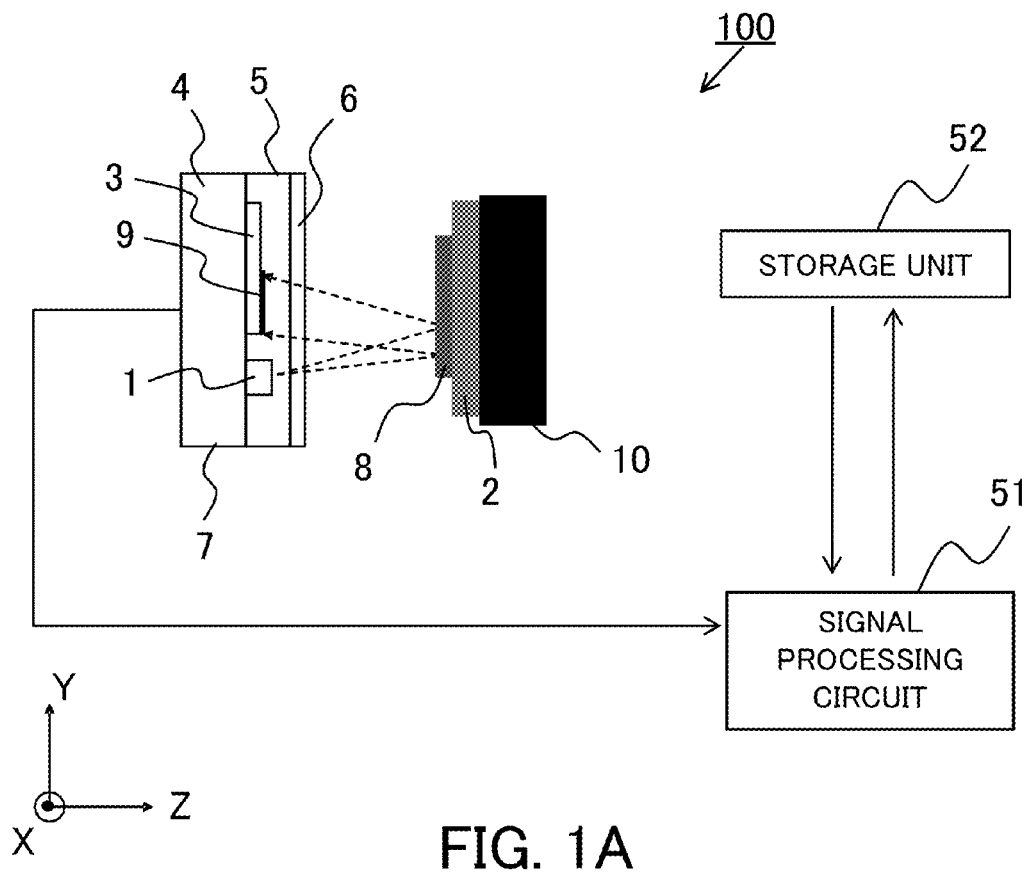
FIGS. 1A and 1B are schematic configuration diagrams of a displacement detection apparatus in the first embodiment.

Exemplary embodiments of the present invention will be described below with reference to the accompanying drawings. In the drawings, the same elements will be denoted by the same reference numerals and the descriptions thereof will be omitted.

First Embodiment

Figure 1B:
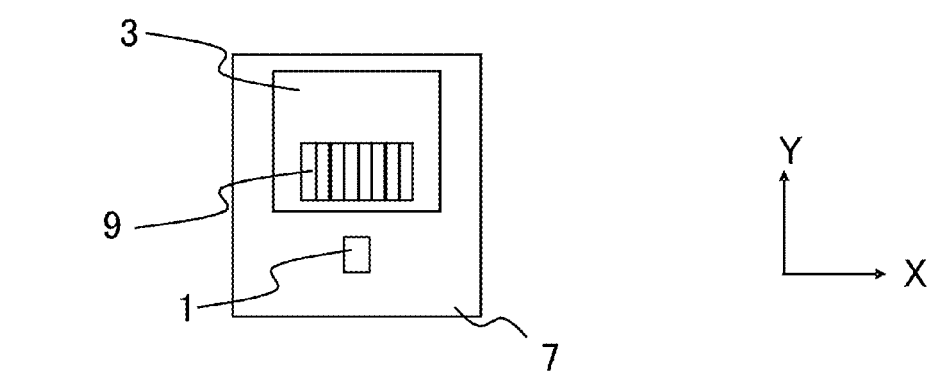

First of all, referring to FIGS. 1A and 1B, a displacement detection apparatus in a first embodiment of the present embodiment will be described. FIGS. 1A and 1B are schematic configuration diagram of a displacement detection apparatus 100 (an encoder) in the present embodiment, and FIG. 1A illustrates an overall configuration diagram of the displacement detection apparatus 100 and FIG. 1B illustrates a front view (a diagram viewed from +Z direction) of a sensor unit 7 constituting the displacement detection apparatus 100. The displacement detection apparatus 100 is configured by including a movable portion 10 (an object to which a scale is attached), a scale 2 attached to the movable portion 10, a sensor unit 7 attached to a fixed portion (not shown), a signal processing circuit 51, and a storage unit 52. In this configuration, the displacement detection apparatus 100 is capable of detecting a position of an object (an object to be measured) by using the scale 2.

The signal processing circuit 51 (a signal processor) processes an output signal of the sensor unit 7 (a detector, a detection unit, or a sensor) to obtain position information of the object. In other words, the signal processing circuit 51 performs an interpolation processing of a detection signal (an encoder signal) outputted from the sensor unit 7, writes and reads a signal to and from the storage unit 52, outputs a position signal, and the like. The displacement detection apparatus 100 is a reflective-type optical displacement detection apparatus, but the present embodiment is not limited to this, and for example a transmissive-type optical displacement detection apparatus can also be used. The present embodiment can also be applied to a magnetic-type displacement detection apparatus or a capacitance-type displacement detection apparatus, instead of the optical displacement detection apparatus.

The sensor unit 7 (the detector) includes a light source 1 having an LED and a light receiving element 3 having a light receiving element array 9. The light receiving element 3 (or other semiconductor devices) is provided with a signal processing circuit portion (a photo IC chip) that performs a signal processing such as a photoelectric conversion of a light received by the light receiving element array 9. The light source 1 and the light receiving element 3 are mounted on a printed circuit board 4 and are sealed by using a resin 5. A transparent glass substrate 6 is provided on the resin 5. Thus, the sensor unit 7 is a sensor unit that is configured by packaging these members and that is integrally configured by a light emitting device and a light receiving device.

The sensor unit 7 is disposed so as to face (so as to be opposed to) the scale 2, and is configured so as to be movable relative to the scale 2. A divergent light beam emitted from the light source 1 inside the sensor unit 7 is illuminated on a scale track 8 of the scale 2. The light beam reflected by the scale track 8 is reflected towards the light receiving element array 9 inside the sensor unit 7. A reflectance distribution (an average reflectance distribution) from the scale track 8 is received as an image on the light receiving element array 9. The light beam received by the light receiving element array 9 is converted to an electric signal (i.e. photoelectric conversion), and is sent as an encoder signal (a detection signal) from the sensor unit 7 to the signal processing circuit 51.

Subsequently, referring to FIGS. 2A and 2B, a configuration of the scale 2 in the present embodiment will be described. FIGS. 2A and 2B are configuration diagrams of the scale 2, and FIG. 2A illustrates a top view of the scale 2 and FIG. 2B illustrates an enlarged view of a region 150 in FIG. 2A. The scale 2 is for example configured by patterning a chromium film (a reflection film or a reflection coating) as the scale track 8 on a base material such as a glass. As the base material of the scale 2, a resin such as a poly carbonate or a metal such as SUS can also be used. Instead of the chromium film, other kinds of reflection films such as aluminum may also be used.

As illustrated in FIGS. 2A and 2B, the scale track 8 includes a scale pattern 101 that is periodically formed with a modulation period P1 in an X direction that is a measurement direction. In other words, each of the plurality of scale patterns 101 is a pattern that is formed periodically (with the modulation period P1) along the measurement direction, similarly to each of the plurality of scale track 8. When the displacement detection apparatus 100 (the encoder) is assembled, drives, or the like, a position of the scale 2 (the scale track 8) may be shifted from a nominal size (a design position) in a direction perpendicular to the measurement direction with respect to the sensor unit 7, i.e. a Y direction perpendicular to the measurement direction (a periodic direction). In such a movement, the scale track 8 (the scale pattern 101) is configured so as to change a physical property in the direction perpendicular to the measurement direction without changing phase information in the measurement direction. Accordingly, a relative position relation between the scale 2 and the sensor unit 7 in the direction perpendicular to the measurement direction can also be detected according to the change of the physical property read by the sensor unit 7. The physical properties of the scale track 8 and the scale pattern 101 change so as to uniquely determine the position in the direction perpendicular to the measurement direction. In the present embodiment, since the optical displacement detection apparatus 100 is used, the physical property is for example a reflectance distribution (an average reflectance distribution). The measurement direction means the X direction as described above, which is a direction of periodicity of the plurality of scale tracks 8 or the plurality of scale patterns 101 formed in the scale 2.

Thus, the scale pattern 101 is configured so that the distribution (the reflectance distribution) of the scale pattern 101 is different according to the position in the Y direction that is the direction perpendicular to the measurement direction. In other words, the scale pattern 101 is configured by arraying a plurality of pattern portions (five pattern portions in the present embodiment) in the direction (the Y direction) perpendicular to the measurement direction. Each of the pattern portions is arranged within a width Y1, and is configured so that the width of the pattern portion (a proportion to the width Y1) is increased from a lower side toward an upper side in FIG. 2.

Therefore, in the present embodiment, when the detection position is displaced (shifted) in a +Y direction, amplitudes of position detection signals S(A) and S(B) in the X direction increase. The position detection signals S(A) and S(B) are signals that have a relative phase difference of 90 degrees. Details of the position detection signals S(A) and S(B) will be described below. The present embodiment is not limited to this. For example, when a magnetic-type displacement detection apparatus is used, the physical property is a magnetic strength distribution.

As illustrated in FIGS. 2A and 2B, the distribution of the scale pattern 101 in the present embodiment is a distribution in which an area of the pattern (a reflection film or a reflection coating) changes depending on the position in the Y direction. However, the present embodiment is not limited to this, and the pattern (the reflection film) may also be configured so that the reflectance of the pattern changes depending on the position in the Y direction. In the present embodiment, the pattern of the scale 2 has a period P1 of 100 μm and a width Y1 of 50 μm in the Y direction, but the embodiment is not limited to this.

Figure 3:
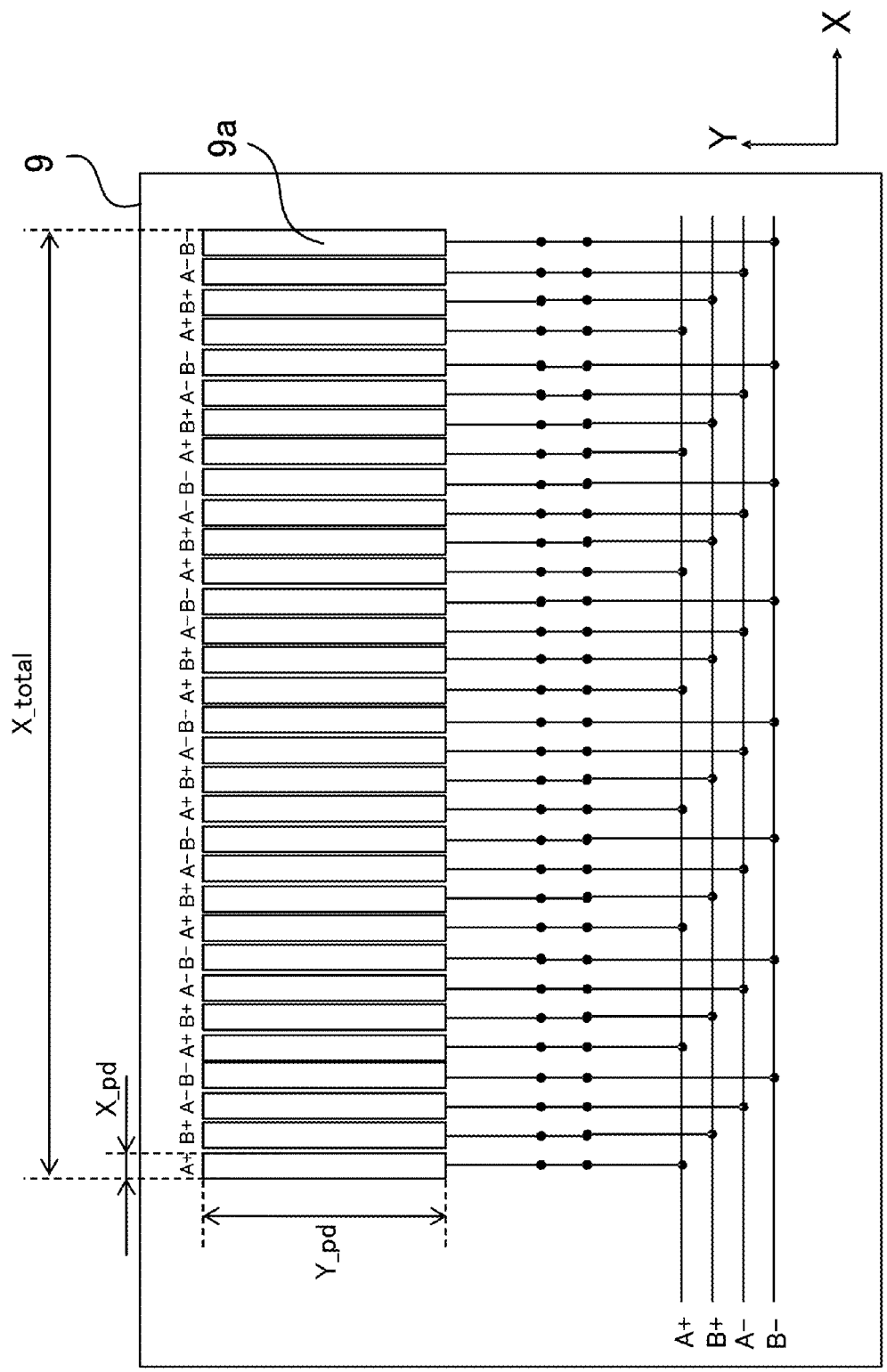
FIG. 3 is a plan view of a light receiving surface of a light receiving element array in the first embodiment.

Subsequently, referring to FIG. 3, a configuration of the light receiving element array 9 in the present embodiment will be described. FIG. 3 is a plan view of a light receiving surface of the light receiving element array 9. The light receiving element array 9 is configured so that 32 light receiving elements 9a are arrayed with a pitch of 50 μm in the X direction. With respect to one light receiving element 9a, a width X_pd in the X direction is 50 μm and a width Y_pd in the Y direction is 800 μm. A total width X total of the light receiving element array 9 is 1600 μm. The pattern is projected on the scale 2 so as to be enlarged twice. Therefore, a detection range on the scale 2 is within a range of 800 μm in the X direction and 400 μm in the Y direction. Accordingly, based on the relation of the width Y_pd (=400 μm) and the width Y1 (=50 μm), the detection range on the scale 2 is within a range of 8 lines of the scale patterns 101 (Y1×8).

Figure 4:
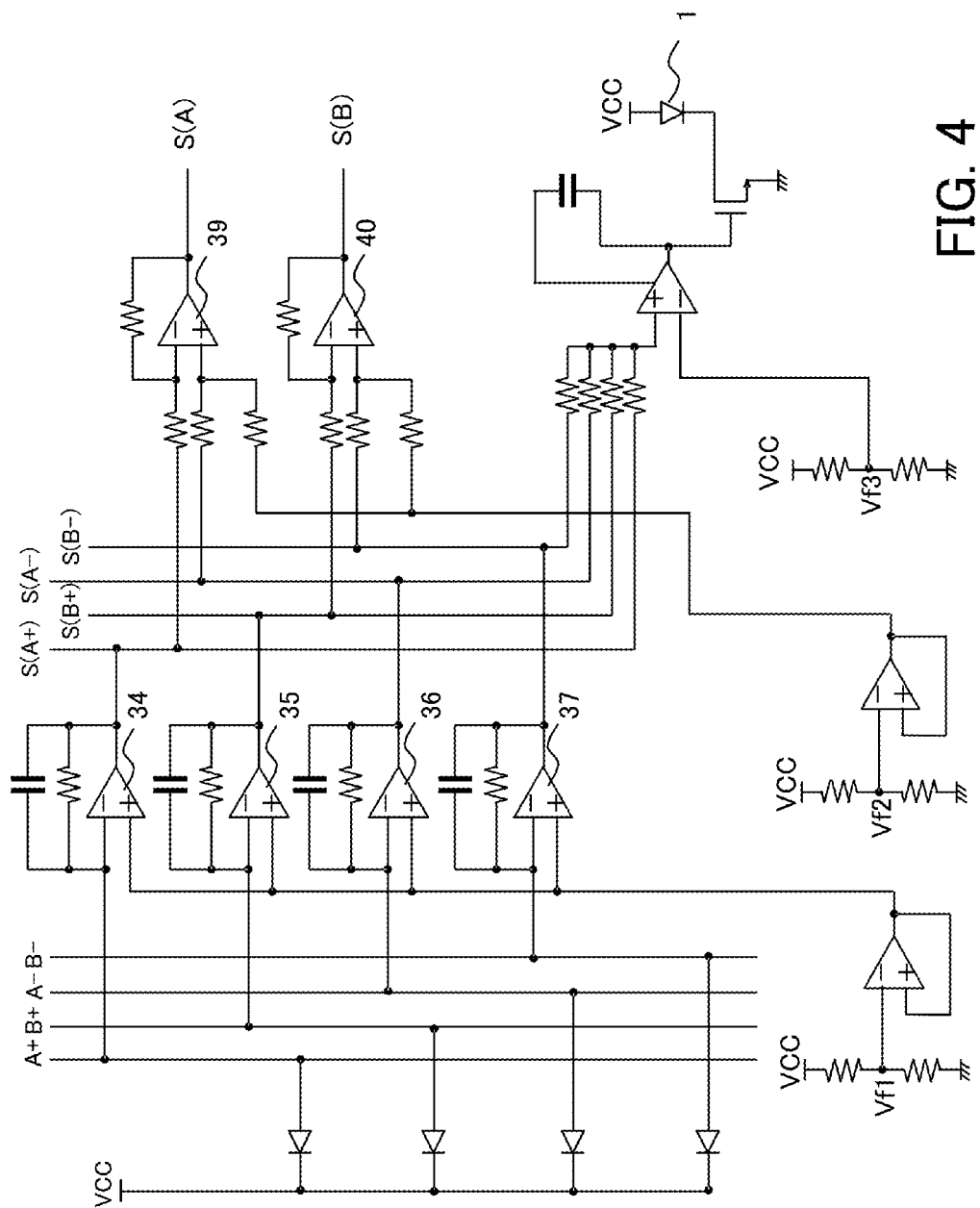
FIG. 4 is a configuration diagram of a signal processing circuit portion of a sensor unit in the first embodiment.

Subsequently, referring to FIG. 4, a configuration of the signal processing circuit portion of the sensor unit 7 in the present embodiment will be described. FIG. 4 is a configuration diagram of the signal processing circuit portion of the sensor unit 7. Output signals (A+, B+, A−, and B−) from the light receiving element array 9 are input to four first amplifiers 34, 35, 36, and 37 of the signal processing circuit portion, respectively. As illustrated in FIG. 4, four I-V conversion amplifiers are used as the first amplifiers 34, 35, 36, and 37 that are used to generate four-phase sine wave signals S(A+), S(B+), S(A−), and S(B−) as position detection signals.

Relative phases of the four-phase sine wave signals S(A+), S(B+), S(A−), and S(B−) for a detection pitch have relations of around +90 degrees for S(B+), around +180 degrees for S(A−), and around +270 degrees for S(B−) with reference to S(A+). Using outputs of these four-phase sine wave signals S(A+), S(B+), S(A−), and S(B−), the signal processing circuit portion (or the signal processing circuit 51) performs calculations represented by the following Expressions (1) and (2) via an A-phase differential amplifier 39 and a B-phase differential amplifier 40. As a result, two-phase sine wave signals S(A) and S(B) in which direct-current components are removed are generated.

$$S(A)=S(A+)-S(A-) \tag{1}$$

$$S(B)=S(B+)-S(B-) \tag{2}$$

In the embodiment, it is preferred that an offset error and a gain ratio contained in the two-phase sine wave signals S(A) and S(B), which are caused by an offset, a gain variability, and the like of the A-phase differential amplifier 39 and the B-phase differential amplifier 40, are corrected. For example, an amplitude ratio is detected based on (maximum value−minimum value)/2 of each of the two-phase sine wave signals S(A) and S(B) in a predetermined region and then the correction is performed so that the amplitudes are equal to each other. Similarly, based on (maximum value+ minimum value)/2, the offset error is detected and then the correction of the offset is performed. In any cases, the correction value is previously stored in the storage unit 52, and the correction can be performed by reading the correction value at the time of detecting the position.

The, the signal processing circuit 51 performs a calculation represented by the following Expression (3) to obtain a phase Φ1 of the scale 2.

$$\Phi 1=\text{ATAN } 2[S(A),S(B)] \tag{3}$$

Figure 5:
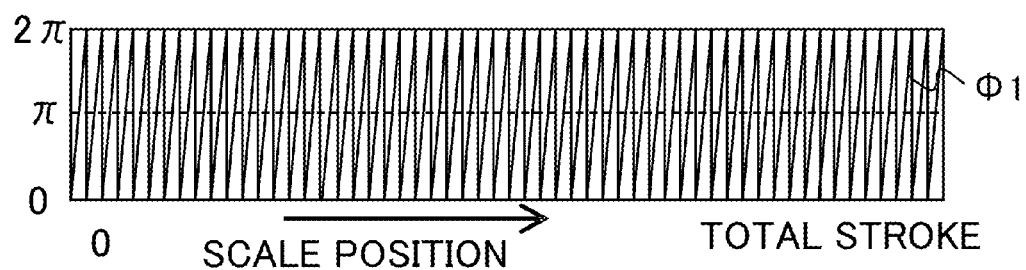
FIG. 5 is a diagram of illustrating a relation between a phase $\Phi1$ and a scale position in the first embodiment.

In Expression (3), symbol ATAN 2[Y,X] is an arctangent function that determines a quadrant to be converted to a phase of 0 to 2π. FIG. 5 is a diagram of illustrating a relation between the phase Φ1 and the position of the scale 2 (the scale position) in the X direction. The phase Φ1 is used as an incremental signal to detect the position (a relative position) in the X direction.

Subsequently, the signal processing circuit 51 performs a calculation represented by the following Expression (4), and thus the signal processing circuit 51 obtains the amplitude signal amp1.

$$\text{amp1}=\text{SQRT}[S(A)^2+S(B)^2] \tag{4}$$

In Expression (4), symbol SQRT[X] is a function which calculates the square root.

Figure 6:
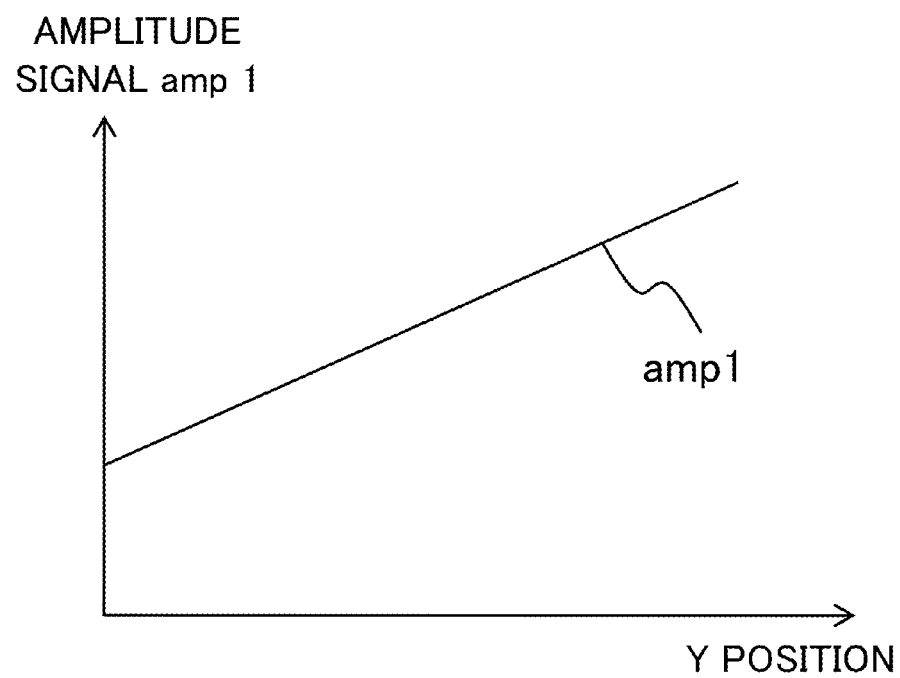
FIG. 6 is a diagram of illustrating a relation between an amplitude signal amp1 and a Y position in the first embodiment.

The distribution of the scale pattern 101 is different depending on the position in the Y direction (the position in the direction perpendicular to the measurement direction). FIG. 6 is a diagram of illustrating a relation between the amplitude signal amp1 and the relative position (the Y position) between the sensor unit 7 and the scale 2. Using the relation, the signal processing circuit 51 can uniquely determine a relative position relation (a relative position) between the sensor unit 7 and the scale 2 in the Y direction based on a value of the amplitude signal amp1 obtained by Expression (4). Instead of using Expression (4), it may also be configured so that the position in the Y direction can be determined based on the amplitude itself of the two-phase sine wave signal S(A) or S(B).

Thus, according to the present embodiment, a displacement detection apparatus (an incremental-type displacement detection apparatus) capable of detecting the phase in the X direction that is the measurement direction and uniquely determining the relative position relation between the sensor unit 7 and the scale 2 in the Y direction can be provided. Furthermore, in the present embodiment, since the phase information of the measurement direction is not influenced, a displacement detection apparatus capable of performing position detection in the measurement direction with high accuracy can be provided. The present embodiment describes the optical-type displacement detection apparatus, but is not limited to this. For example, the present embodiment can also be applied to a magnetic-type displacement detection apparatus or a capacitance-type displacement detection apparatus.

Second Embodiment

Figure 7A:
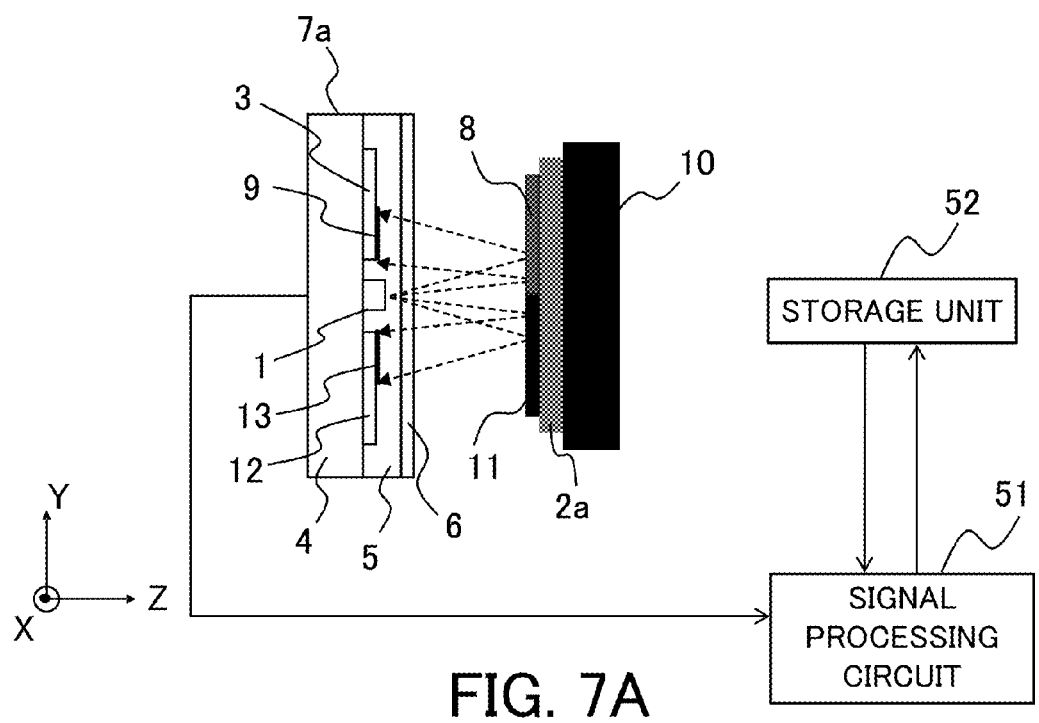
FIGS. 7A and 7B are schematic configuration diagrams of a displacement detection apparatus in the second embodiment.
Figure 7B:
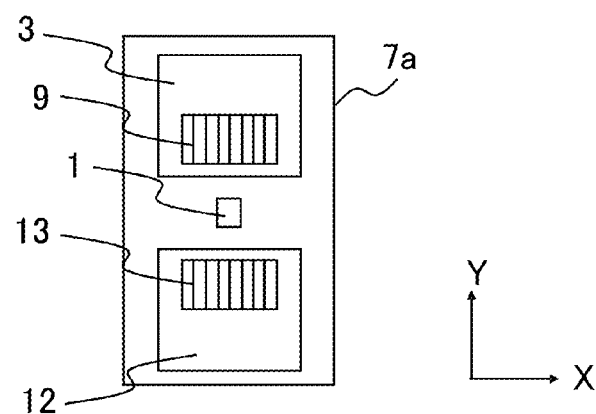

Next, referring to FIGS. 7A, 7B, 8A, and 8B, a displacement detection apparatus in a second embodiment of the present invention will be described. FIGS. 7A and 7B are schematic configuration diagrams of a displacement detection apparatus 100a (an encoder) in the present embodiment, and FIG. 7A illustrates an overall configuration diagram of the displacement detection apparatus 100a and FIG. 7B illustrates a front view (a diagram viewed from a +Z direction) of a sensor unit 7a constituting the displacement detection apparatus 100a. FIGS. 8A and 8B are configuration diagrams of a scale 2a, and FIG. 8A illustrates a top view of the scale 2a and FIG. 8B illustrates an enlarged view of a region 150a in FIG. 8A.

As illustrated in FIGS. 8A and 8B, the scale 2a of the present embodiment is configured by including two scale tracks 8 and 11. In addition, as illustrated in FIGS. 7A and 7B, the displacement detection apparatus 100a of the present embodiment is configured to be able to detect each of patterns of the two scale tracks 8 and 11. In the present embodiment, since two light receiving elements 3 and 12 (light receiving element arrays 9 and 13) can share parts (components) and have advantages that reduce the cost and the like, the same element as the light receiving element in the first embodiment is used, but the embodiment is not limited to this. For example, separated light receiving elements each of which is optimized to have a modulation period of the track to be read may also be used.

The displacement detection apparatus 100a of the present embodiment is an absolute-type displacement detection apparatus capable of detecting an absolute position. The absolute position means that a position of a pattern (and an object on which the pattern is formed) relative to a detector, i.e. a position relative to a fixed portion of a moving object to be measured. This absolute-type displacement detection apparatus is an apparatus capable of detecting a relative position between the pattern (the object) and the detector ("absolute position" in the present embodiment) by performing one measurement using the detector (the sensor unit). There is also an incremental-type displacement detection apparatus that can only detect a change of a position using a detector, which is different from the absolute-type displacement detection apparatus. The present embodiment can also be applied to the incremental-type displacement detection apparatus. This incremental-type displacement detection apparatus is an apparatus that detects the change of the position as described above, which determines an absolute position in association with a result of an origin detection apparatus separately provided (an apparatus which can unambiguously determine a relative position).

As illustrated in FIGS. 8A and 8B, the scale 2a of the present embodiment includes the scale tracks 8 and 11. The scale track 8 is configured by including a scale pattern 201 having a modulation period P2 in the X direction that is the measurement direction. The scale track 11 is configured by including a scale pattern 301 having a modulation period P3 in the X direction that is the measurement direction. The scale pattern 301 in the scale track 11 has a different distribution of forming a pattern depending on the position in the direction (the Y direction) perpendicular to the measurement direction. Therefore, when the detection position is shifted in a +Y direction, the amplitudes of the position detection signals (the two-phase sine wave signals S(A) and S(B)) in the X direction increase. In the present embodiment, similarly to the case of the first embodiment, the reflectance of the pattern may also be configured so as to change depending on the position in the Y direction.

In the scale 2a of the present embodiment, the modulation P2 and the modulation period P3 are slightly different from each other. Commonly, a position detection method called a vernier calculation in which a phase difference between modulation periodic signals is calculated by using these modulation periods to obtain a periodic signal having a period different from each of periods of the original signals is known. For example, a period (a vernier period) of a vernier detection signal obtained from the modulation periods P2 and P3 are the least common multiple of the modulation periods P2 and P3. In the present embodiment, the modulation periods P2 and P3 are determined so that a desired vernier period can be obtained.

In the scale 2a of the present embodiment, the modulation period P2 of the scale pattern 201 is 100 μm, and the modulation period P3 of the scale pattern 301 is 100×(400/399)μm. Thus, a ratio of the modulation periods P2 and P3 (pitches) of the two scale patterns 201 and 301 is slightly different from an integral multiple, and a total stroke is 40000 μm. In the present embodiment, the width Y1 of the scale pattern 301 in the Y direction is 50 μm. However, the present embodiment is not limited to this, and other values may also be adopted as the ratio of the pitches, the total stroke, or the width in the Y direction.

First of all, with respect to the scale track 8, a method of obtaining the phase information will be described. The phase information obtained from the scale track 8 can be obtained similarly to the first embodiment. Then, a calculation represented by the following Expression (5) is performed by using the obtained two-phase sine wave signals S(A) and S(B), and thus a phase Φ2 of the scale 2a (the scale track 8) is obtained.

$$\Phi 2 = \text{ATAN } 2[S(A), S(B)] \quad (5)$$

Figure 9A:
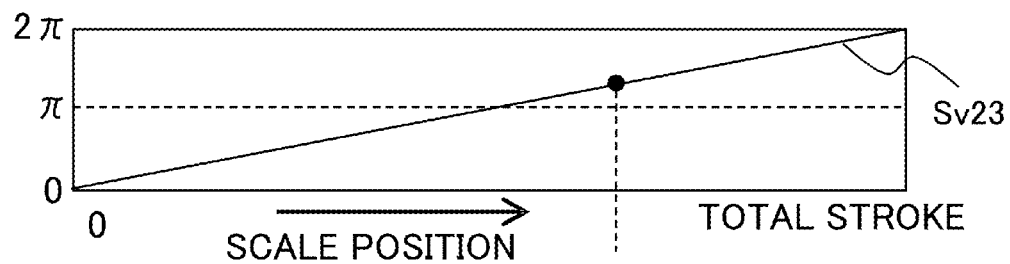
FIGS. 9A and 9B are diagrams of describing detection of an absolute position in the second embodiment.
Figure 9B:
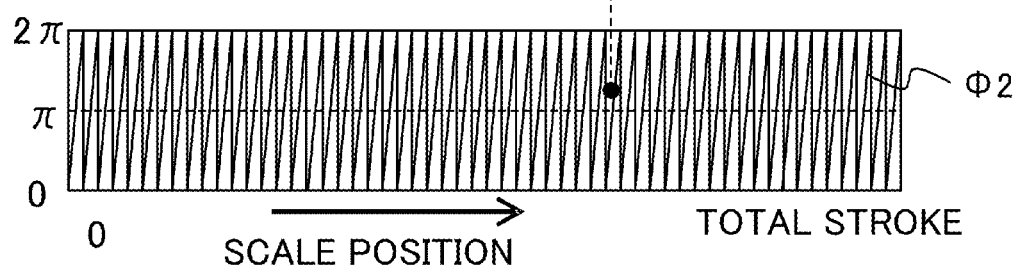

FIGS. 9A and 9B are diagrams of describing the detection of the absolute position in the present embodiment. FIG. 9B is a diagram of describing a relation between the phase Φ2 and the scale position, and the incremental signal can be used to detect a change of the relative position in the X direction. An amplitude signal amp2 is obtained by using the following Expression (6).

$$\text{amp2} = \text{SQRT}[S(A)^2 + S(B)^2] \quad (6)$$

In order to improve S/N (signal to noise) with respect to a noise generated by the first amplifier for the I-V conversion in the sensor, it is preferred that an emission light amount is set to be large within a range of limiting a dynamic range of a detection circuit. Furthermore, in order to keep this state, it is preferred that the emission light amount is controlled. In the present embodiment, based on the signals S(A+), S(B+), S(A−), and S(B−) obtained from the scale track 8, a sum signal SUM is obtained by using the following Expression (7).

$$\text{SUM} = S(A+) + S(B+) + S(A-) + S(B-) \quad (7)$$

Then, the emission light amount of the light source 1 is controlled so that the sum signal SUM is to be constant.

Subsequently, with respect to the scale track 11, a method of obtaining the phase information will be described. For the phase signal (the phase information) obtained from the scale track 11, 100 μm×(400/399)×2 that is twice the pattern period on the scale is slightly different from the detection pitch (200 μm) of the light receiving element array 13. Therefore, it is preferred that a correction process of the relative phase difference between the two-phase sine wave signals S(A)' and S(B)' is performed. Hereinafter, a method of correcting the phase difference in the present embodiment will be described.

The two-phase sine wave signals S(A)' and S(B)' containing an error e of the relative phase difference are represented by the following Expressions (8) and (9), respectively, where symbol θ is a phase.

$$S(A)' = \cos(\theta + e/2) \quad (8)$$

$$S(B)' = \sin(\theta - e/2) \quad (9)$$

Then, when a sum and a difference of the two-phase signal wave signals S(A)' and S(B)' are calculated by using Expressions (8) and (9), respectively, an error component (the error e) can be separated as represented by the following Expressions (10) and (11).

$$S(A)' + S(B)' = 2 \times \cos(\theta - \pi/4)\sin(e/2 - \pi/4) \quad (10)$$

$$-S(A)' + S(B)' = 2 \times \sin(\theta - \pi/4)\cos(e/2 - \pi/4) \quad (11)$$

The error e of the relative phase difference is obtained as e=(1−399/400)×π based on a design value. Then, for each of the amplitude components 2×sin(e/2−π/4) and 2×cos(e/2−π/4) of Expressions (10) and (11), an inverse is multiplied. As a result, as represented by the following Expressions (12) and (13), the two-phase sine wave signals S(A) and S(B) in which the phase difference error has been corrected are calculated, respectively.

$$S(A) = (S(A)' + S(B)')/(2 \times \sin(e/2 - \pi/4)) = \cos\phi \quad (12)$$

$$S(B) = (-S(A)' + S(B)')/(2 \times \cos(e/2 - \pi/4)) = \sin\phi \quad (13)$$

In Expressions (12) and (13), φ is equal to θ−π/4 (φ=θ−π/4).

The error e of the relative phase difference may be stored when an initialization operation is performed. For example, based on (maximum value−minimum value)/2 of S(A)'+S(B)' within a predetermined range in the X direction, the amplitude component of 2×sin(e/2−θ/4) can be obtained. Alternatively, based on (maxim value−minimum value)/2 of −S(A)'+S(B)', the amplitude component of 2×cos(e/2−π/4) may be obtained so as to be stored in the storage unit 52. In this case, the correction can be also performed including the influence of a displacement of the height of the mount between the light source 1 and the light receiving element array 9 or an error of an image magnification caused by a relative inclination between the scale 2 and the sensor unit 7. Similarly to the first embodiment, it is preferred that the offset error or the gain ratio contained in the two-phase sine wave signals S(A) and S(B) caused by the offset or the gain variability of each amplifier is corrected.

In the present embodiment, using the two-phase sine wave signals S(A) and S(B) obtained as described above, a calculation represented by the following Expression (14) is performed to obtain a phase Φ3 of the scale 2a (the scale track 11).

$$\Phi 3 = \text{ATAN } 2[S(A), S(B)] \quad (14)$$

An amplitude signal amp3 is obtained by a calculation represented by the following Expression (15).

$$\text{amp3} = \text{SQRT}[S(A)^2 + S(B)^2] \quad (15)$$

Furthermore, a vernier signal Sv23 is obtained by a calculation represented by the following Expression (16) using Expressions (5) and (14).

$$Sv23 = \Phi 2 - \Phi 3 \quad (16)$$

When Sv23<0 is satisfied, the calculation of Sv23=Sv23+2π is performed to be converted to an output range of 0 to 2π. FIG. 9A is a diagram of illustrating a relation between the vernier signal Sv23 obtained described above and the scale position. As illustrated in FIG. 9A, the scale position with respect to the detected phase Sv23 is uniquely determined, and therefore the scale position can be specified.

Thus, the absolute position can be detected only by using the vernier signal Sv23, but in the present embodiment, a synchronization process of the vernier signal Sv23 and the phase Φ2 is performed to generate a more highly-accurate absolute position signal ABS.

$$\text{ABS} = (\text{ROUND}[((Sv23/(2\pi)) \times (FS/P2) - \Phi 2) \times (2\pi)] + \Phi 2/(2\pi)) \times P2[\mu m] \quad (17)$$

In Expression (17), symbol ROUND[X] is a function of converting X to an integer closest to X. Symbol FS is a total stroke in the X direction, and FS is equal to 40000 μm (FS=40000 μm) in the present embodiment.

Next, in order to obtain the relative position between the sensor unit 7 and the scale 2a in the Y direction, the amplitude signal S_amp23 is obtained by a calculation represented by the following Expression (18).

$$S\_amp23 = (\text{amp2} - \text{amp3})/(\text{amp2} + \text{amp3}) \quad (18)$$

In the present embodiment, when a light amount of the light source 1 is changed, both the amplitude signals amp2 and amp3 are changed at the same rate k to be amplitude signals amp2' and amp3', respectively. In this case, for the amplitude signal S_amp23', the same result as that of Expression (18) is obtained as represented by the following Expression (19).

$$\begin{aligned} S\_amp23' &= (\text{amp2}' - \text{amp3}')/(\text{amp2}' + \text{amp3}') \\ &= \{k \times (\text{amp2} - \text{amp3})\}/\{k \times (\text{amp2} + \text{amp3})\} \\ &= (\text{amp2} - \text{amp3})/(\text{amp2} + \text{amp3}) \end{aligned} \quad (19)$$

Figure 10:
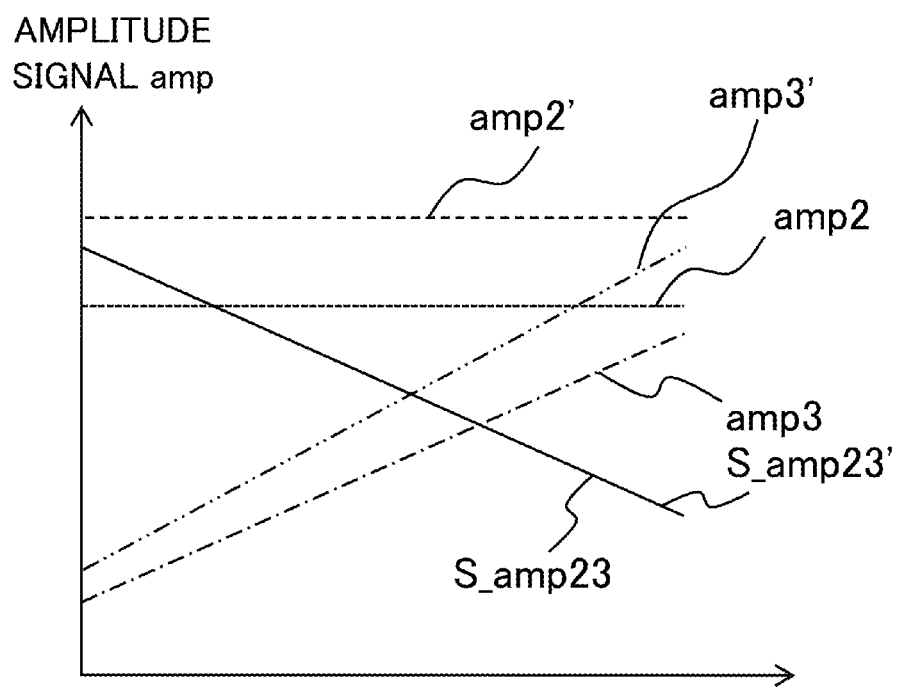
FIG. 10 is a diagram of illustrating a relation between each amplitude signal and a Y position in the second embodiment.

The scale 2a of the present embodiment has a distribution of forming the scale pattern 301 which is different depending on the position in the Y direction. FIG. 10 is a diagram of illustrating a relation between each of the amplitude signals (S_amp23, amp2, amp3, S_amp23', amp2', and amp3') and the Y position (the relative position between the sensor unit 7 and the scale 2a in the Y direction). In FIG. 10, solid lines indicate S_amp23 and S_amp23', a dotted line indicates amp2, a dashed-dotted line indicates amp3, a dashed line indicates amp2', and a dashed-two dotted line indicates amp3'. As illustrated in FIG. 10 and as represented by Expression (19), the amplitude signals S_amp23 and S_amp23' are the same value depending on the relative position between the sensor unit 7 and the scale 2a in the Y direction even when the emission light amount of the light source 1 is varied. Therefore, the variation of the emission light amount from the light source 1 can be canceled.

As represented by Expression (7), when the emission light amount of the light source 1 is controlled so that the sum signal SUM is to be constant, the value of the amplitude signal amp2 is constant independently of the relative position between the sensor unit 7 and the scale 2a in the Y direction. Therefore, simply, amp2−amp3 may also be calculated.

As described above, in the present embodiment, a comparison calculation of the amplitude signal amp2 from the scale track 8 and the amplitude signal amp3 from the scale track 11 is performed. As a result, even when the emission light amount from the light source 1 is varied, the relative position relation between the sensor unit 7 and the scale 2a in the Y direction can be uniquely determined. Therefore, compared to the first embodiment, a displacement detection apparatus capable of evaluating the relative position relation between the sensor unit 7 and the scale 2a in the Y direction with higher accuracy can be provided. Also in the present embodiment, since the phase information in the measurement direction are not influenced, the displacement detection apparatus capable of detecting a position in the measurement direction with higher accuracy can be provided.

Third Embodiment

Figure 11:
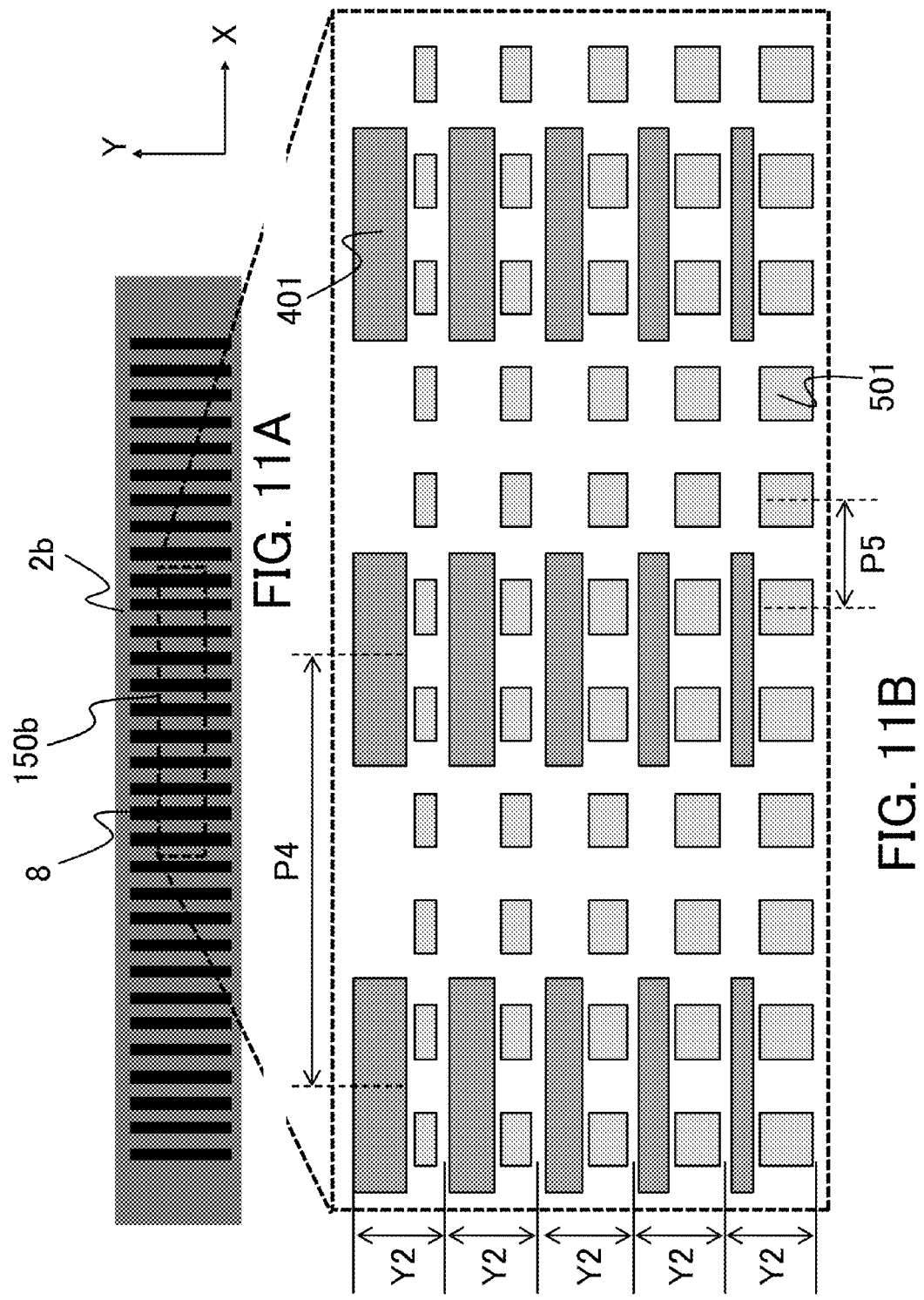
FIGS. 11A and 11B are configuration diagrams of a scale in the third embodiment.

Next, referring to FIGS. 11A and 11B, a displacement detection apparatus (an encoder) in a third embodiment of the present invention will be described. FIGS. 11A and 11B are configuration diagrams of a scale 2b in the present embodiment, and FIG. 11A illustrates a top view of the scale 2b and FIG. 11B illustrates an enlarged view of a region 150b in FIG. 11A.

As illustrated in FIGS. 11A and 11B, the scale 2b of the present embodiment is configured by including a scale pattern 401 having a modulation period P4 and a scale pattern 501 having a modulation period P5 in the X direction that is a measurement direction in a scale track 8. In the present embodiment, the modulation period P4 of the scale pattern 401 is 400 μm, and the modulation period P5 of the scale pattern 501 is 100×(400/399)μm, and thus a ratio of the modulation periods (pitches) of the two scale patterns 401 and 501 is slightly different from an integral multiple. Furthermore, in the present embodiment, a case where a total stroke is 40000 μm is described.

Each of the scale patterns 401 and 501 has a distribution of forming the pattern which is different according to (depending on) the position in the Y direction. The directions of changing the distributions are opposite to each other. In FIGS. 11A and 11B, the scale pattern 401 is configured so that the amplitudes S(A) and S(B) of the detection signals at positions in the X direction are increased when the detection position is displaced (shifted) in the +Y direction, i.e. so that an area of the pattern has a dependency in the Y direction. In addition, the scale pattern 501 is configured so that the amplitudes S(A) and S(B) of the detection signals at the positions in the X direction are decreased when the detection position is displaced (shifted) in the +Y direction, i.e. so that an area of the pattern has a dependency in the Y direction. In the present embodiment, similarly to the case of the first embodiment and the second embodiment, the reflectance of the pattern may be changed depending on the position in the Y direction.

In the present embodiment, it is preferred that the sum of the areas of the scale patterns 401 and 501 with respect to the light receiving element array 9 is to be constant independently of the Y position (the position along the Y direction). According to this configuration, the emission light amount of the light source 1 can be controlled based on the sum of the signals S(A+), S(B+), S(A−), and S(B−) obtained from each of the modulation period P4 and the modulation period P5.

In the present embodiment, the configuration in which the scale patterns having the two modulation periods P4 and P5 are formed on the scale 2b is described, but the number of kinds of the modulation periods provided on the scale 2b is not limited to two, and two or more modulation periods may be adopted. In addition, the displacement detection apparatus of the present embodiment is substantially the same as the displacement detection apparatus 100 described in the first embodiment with reference to FIGS. 1A and 1B, but is different in that a detection resolution is switched via a switching circuit to be able to separately obtain each of the signals from the pattern.

Hereinafter, a detection of the two modulation periods by switching the two detection resolutions will be described, but the number of the detectable resolutions is not limited to this, and it may be more than or equal to the number of kinds of the modulation periods of the scale. The displacement detection apparatus of the present embodiment is an absolute-type displacement detection apparatus capable of detecting an absolute position, but the embodiment can also be applied to an incremental-type displacement detection apparatus.

Figure 12:
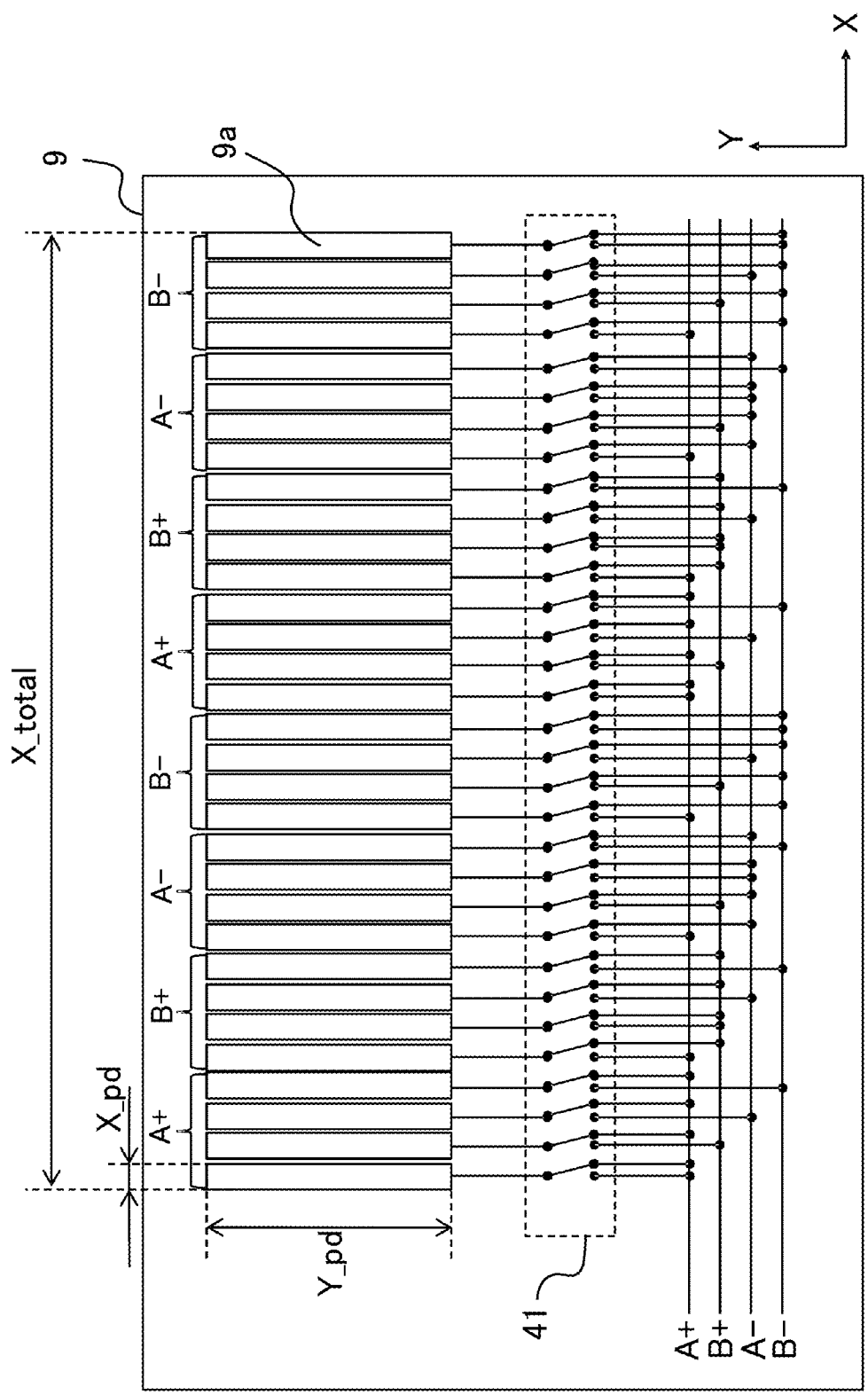
FIG. 12 is a plan view of a light receiving surface of a light receiving element array when a first period is detected in the third embodiment.
Figure 13:
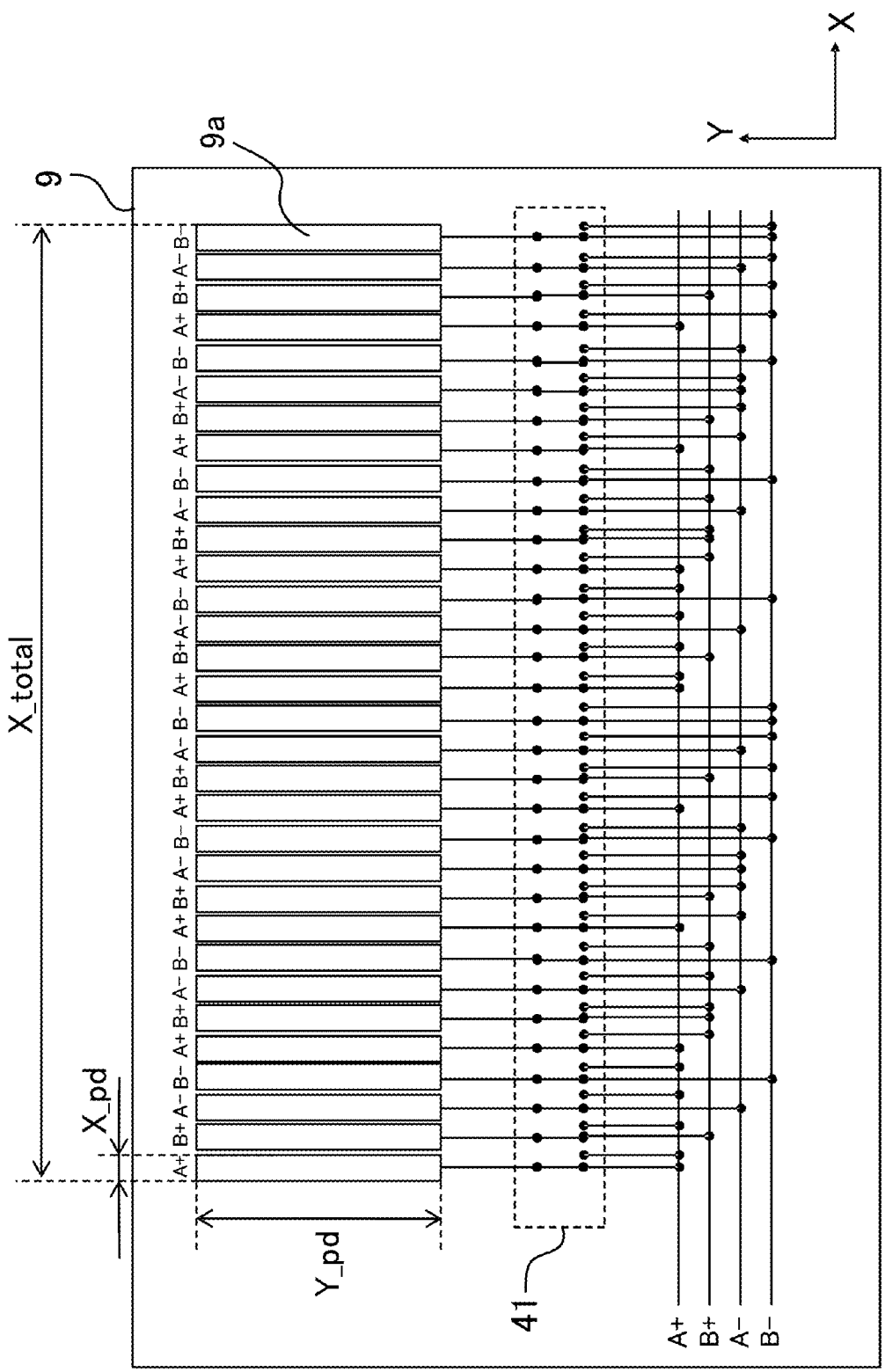
FIG. 13 is a plan view of a light receiving surface of a light receiving element array when a second period is detected in the third embodiment.
Figure 14A:
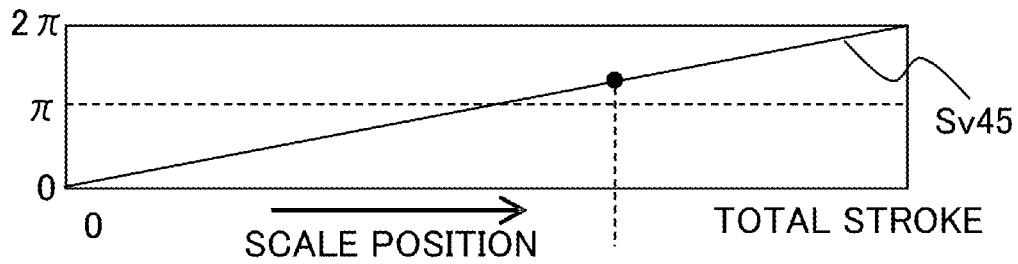
FIGS. 14A and 14B are diagrams of describing detection of an absolute position in the third embodiment.
Figure 14B:
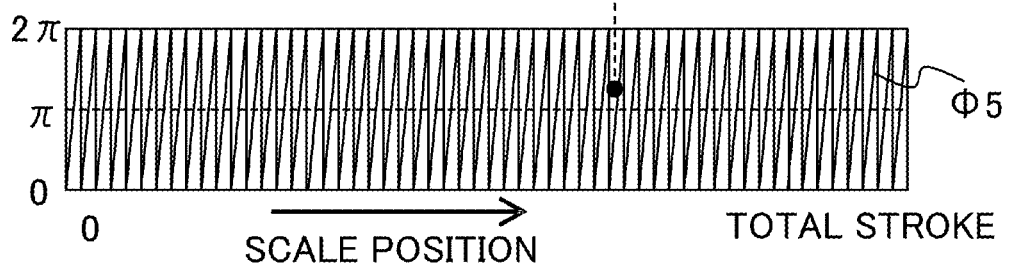

Subsequently, referring to FIGS. 12 to 14A and 14B, a method of detecting the absolute position by switching the detection resolution in the present embodiment will be described. FIG. 12 is a plan view of a light receiving surface of a light receiving element array when a first period is detected in the present embodiment. FIG. 13 is a plan view of the light receiving surface of the light receiving element array when a second period is detected in the present embodiment. FIGS. 14A and 14B are diagrams of describing the detection of the absolute position in the present embodiment.

First of all, the processing of a readout signal obtained from the scale track 8 will be described. An output from each of the light receiving elements is switched via a switch 41 and a switching circuit (not shown), and is selectively connected to four first amplifiers at the subsequent stage. The switching circuit can switch its connection by an input from an external device. For example, when the input is at a high level, as illustrated in FIG. 12, four adjacent light receiving elements 9a are electrically connected to each other, and the outputs of the four light receiving elements 9a are inputted to the same first amplifier. Therefore, a detection pitch of the modulation period of 400 μm (=P4) is obtained.

On the other hand, when the input is at a low level, as illustrated in FIG. 13, every four light receiving elements 9a is electrically connected to each other, and the signals are inputted to the same first amplifier. Therefore, the detection pitch having the modulation period of 100 μm (P5) is obtained. In other words, the periodic signal having the modulation period P4 is separated when the input to the switching circuit is at a high level, and on the other hand, the periodic signal having the modulation period P5 is separated when the input to the switching circuit is at a low level. Thus, in the present embodiment, the detection resolution can be switched by the light receiving element array 9.

First of all, a method of obtaining the phase information when the modulation period P4 (a first modulation period) is detected will be described. When the modulation period P4 is detected, the detection pitch of the light receiving element is equal to the modulation period P4, and therefore similarly to the first embodiment, the signals S(A) and S(B) are obtained. Subsequently, using the obtained signals S(A) and S(B), a calculation represented by the following Expression (20) is performed to calculate a phase Φ4.

$$\Phi 4 = \text{ATAN } 2[S(A), S(B)] \quad (20)$$

Furthermore, an amplitude signal amp4 is obtained by a calculation represented by the following Expression (21).

$$\text{amp4} = \text{SQRT}[S(A)^2 + S(B)^2] \quad (21)$$

Next, a method of obtaining the phase information when the modulation period P5 (a second modulation period) is detected will be described. When the modulation period P5 is detected, the detection pitch of the light receiving element is slightly different from the modulation period P5, and therefore similarly to the modulation period P3 in the second embodiment, the correction processing of the relative phase difference between the two-phase sine wave signals is performed to obtain the signals S(A) and S(B). Subsequently, using the obtained signals S(A) and S(B), a calculation represented by the following Expression (22) to calculate a phase Φ5.

$$\Phi 5 = \text{ATAN } 2[S(A), S(B)] \quad (22)$$

The relation between the phase Φ5 and the scale position is as illustrated in FIG. 14B.

Furthermore, an amplitude signal amp5 is obtained by a calculation represented by the following Expression (23).

$$\text{amp5} = \text{SQRT}[S(A)^2 + S(B)^2] \quad (23)$$

In addition, a vernier signal Sv45 is obtained by a calculation represented by the following Expression (24) using Expressions (20) and (22).

$$Sv45 = \Phi 4 - \Phi 5 \quad (24)$$

When Sv45<0 is satisfied, a calculation of Sv45=Sv45+2π is performed to be converted to an output range of 0 to 2π. The relation between the vernier signal Sv45 obtained as described above and the scale position is as illustrated in FIG. 14A. As illustrated in FIG. 14A, since the scale position with respect to the vernier signal Sv45 that is the detected phase is uniquely determined, the scale position can be specified.

It is possible to detect the absolute position using the vernier signal Sv45 obtained as described above. In the present embodiment, however, in order to perform more highly accurate position detection, the synchronization process of the vernier signal Sv45 and the phase Φ5 is performed and an absolute position signal ABS is generated using the following Expression (25).

$$\text{ABS} = (\text{ROUND}[((Sv45/(2\pi)) \times (FS/P5) - \Phi 5) \times (2\pi)] + \Phi 5/(2\pi)) \times P5 \, [\mu m] \quad (25)$$

In Expression (25), symbol ROUND [X] is a function of converting X to an integer closest to X. Symbol FS is a total stroke in the X direction, and FS is equal to 40000 μm (FS=40000 μm) in the present embodiment.

Subsequently, in order to obtain the relative position between the sensor unit 7 and the scale 2b in the Y direction, the amplitude signal S_amp45 is obtained by a calculation represented by the following Expression (26).

$$S\_\text{amp45} = (\text{amp4} - \text{amp5})/(\text{amp4} + \text{amp5}) \quad (26)$$

In the present embodiment, similarly to the second embodiment, when a light amount of the light source 1 is changed, both the amplitude signals amp4 and amp5 are changed at the same rate k to be amplitude signals amp4' and amp5', respectively. In addition, also for the amplitude signal S_amp45', the same result as the result of Expression (26) is obtained as represented by the following Expression (27).

$$\begin{aligned} S\_\text{amp45}' &= (\text{amp4}' - \text{amp5}')/(\text{amp4}' + \text{amp5}') \quad (27) \\ &= \{k \times (\text{amp4} - \text{amp5})\}/\{k \times (\text{amp4} + \text{amp5})\} \\ &= (\text{amp4} - \text{amp5})/(\text{amp4} + \text{amp5}) \end{aligned}$$

Figure 15:
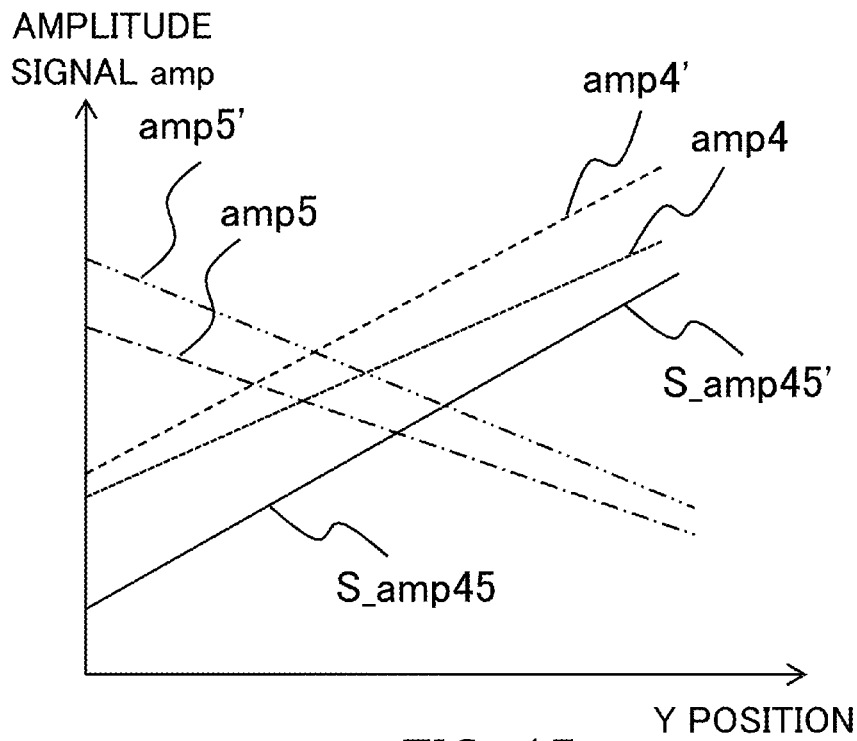
FIG. 15 is a diagram of illustrating a relation between each amplitude signal and a Y position in the third embodiment.

The scale 2b of the present embodiment has distributions of forming the scale patterns 401 and 501 which are different depending on the position in the Y direction. The directions of changing the distributions of the scale patterns 401 and 501 are opposite to each other. FIG. 15 is a diagram of illustrating a relation between each of the amplitude signals (S_amp45, amp4, amp5, S_amp45', amp4', and amp5') and the Y position (the relative position between the sensor unit 7 and the scale 2b in the Y direction). In FIG. 15, solid lines indicate S_amp45 and S_amp45', a dotted line indicates amp4, a dashed-dotted line indicates amp5, a dashed line indicates amp4', and a dashed-two dotted line indicates amp5'.

As illustrated in FIG. 15 and as represented by Expression (27), the amplitude signals S_amp45 and S_amp45' are the same value depending on the relative position between the sensor unit 7 and the scale 2b in the Y direction even when the emission light amount of the light source 1 is varied. Therefore, the variation of the emission light amount from the light source 1 can be canceled.

In addition, the directions of changing the distributions of forming the scale patterns 401 and 501 depending on the position in the Y direction are opposite to each other. In other words, the pattern of the present embodiment includes the scale pattern 401 (a first pattern) formed with the modulation period P4 (a first period) in a measurement direction and the scale pattern 501 (a second pattern) formed with the modulation period P5 (a second period) in the measurement direction. The first pattern includes a plurality of first pattern portions arrayed in a direction perpendicular to the measurement direction, and the second pattern includes a plurality of second pattern portions arrayed in the direction perpendicular to the measurement direction. In addition, each of the plurality of first pattern portions and each of the plurality of second pattern portions are alternately arrayed in the direction perpendicular to the measurement direction. Each of the plurality of first pattern portions changes so that a width (a maximum value of the width) in the direction perpendicular to the measurement direction increases toward a first direction (an upward direction in FIG. 11) of the direction perpendicular to the measurement direction. On the other hand, each of the plurality of second pattern portions changes so that a width (a maximum value of the width) in the direction perpendicular to the measurement direction increases toward a second direction opposite to the first direction (a downward direction in FIG. 11) of the direction perpendicular to the measurement direction. In this configuration, a width of a change of the amplitude signal S_amp45 is increased to be able to correspond to the position in the Y direction with higher accuracy.

In the present embodiment, it is preferred that an average value (an average reflectance distribution) of the physical property within a detection range of a position of an object is constant independently of the position in the direction perpendicular to the measurement direction. More specifically, in the present embodiment, the sum of areas of the scale patterns 401 and 501 with respect to the light receiving element array 9 is to be constant independently of the Y position. Therefore, when the emission light amount of the light source 1 is controlled based on the sum of signals S(A+), S(B+), S(A−), and S(B−) obtained from each of the modulation periods, simply, the position in the Y direction may also be detected based on the calculation result of amp4−amp5.

As described above, in the present embodiment, a comparison calculation of the plurality of amplitude signals amp4 and amp5 from the scale track 8 is performed. As a result, even when the emission light amount from the light source 1 is varied, the relative position relation between the sensor unit 7 and the scale 2b in the Y direction can be uniquely determined. In addition, the widths of the scale patterns 401 and 501 in the Y direction are configured to change in directions opposite to each other depending on the position in the Y direction. Therefore, a width of a change of the amplitude signal S_amp45 is increased to be able to correspond to the position in the Y direction with higher accuracy. Furthermore, it is configured so as not to influence on the phase information, and thus a displacement detection apparatus capable of performing position detection in the measurement direction with high accuracy can be provided.

Fourth Embodiment

Figure 16:
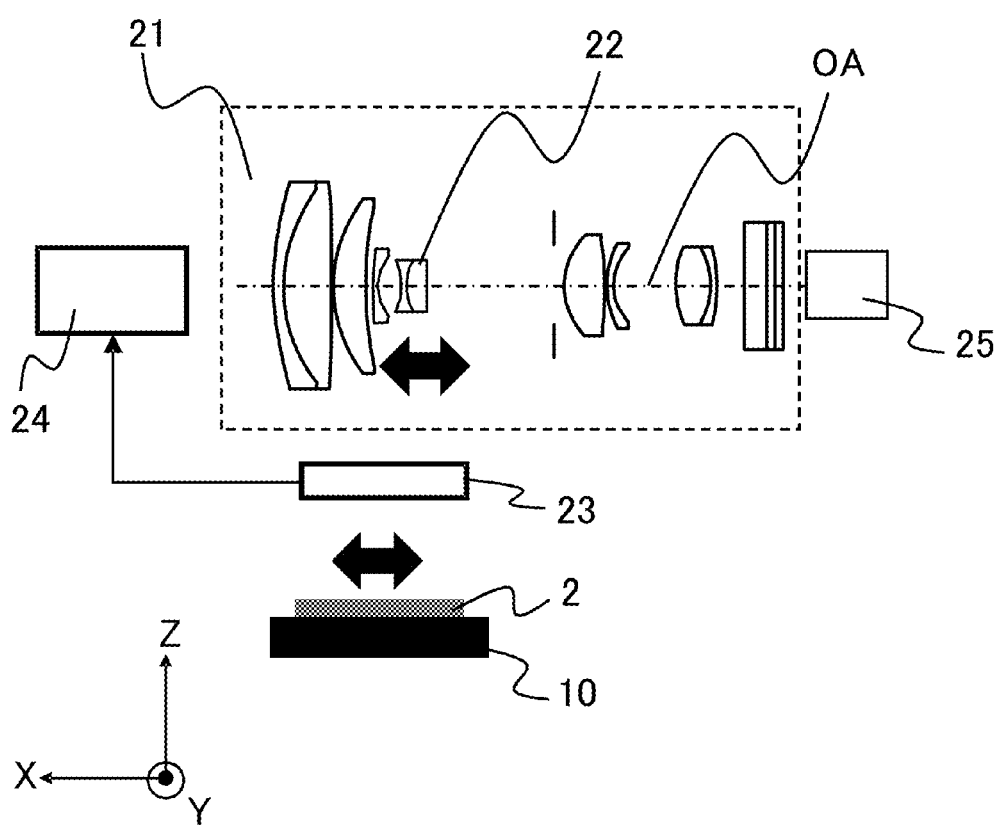
FIG. 16 is a schematic configuration diagram of a lens apparatus (an image pickup system) in the fourth embodiment.

Next, referring to FIG. 16, a fourth embodiment of the present invention will be described. The present embodiment relates to a lens apparatus (a lens barrel) which includes the displacement detection apparatus in each of the embodiments described above. FIG. 16 is a schematic configuration diagram of an image pickup apparatus (an image pickup system) in the present embodiment.

In FIG. 16, reference numeral 21 denotes a lens unit, reference numeral 22 denotes a drive lens (a lens), reference numeral 23 denotes a sensor unit, reference numeral 24 denotes a CPU, and reference numeral 25 denotes an image pickup element. The displacement detection apparatus is configured so as to detect a displacement of the drive lens 22. The image pickup element 25 performs a photoelectric conversion of an object image (an optical image) via the lens unit 21 (the drive lens 22). The lens unit 21, the sensor unit 23, and the CPU 24 are provided in the lens apparatus (the lens barrel), and the image pickup element 25 is provided in an image pickup apparatus body. Thus, the lens apparatus of the present embodiment is configured to be interchangeable with respect to the image pickup apparatus body. However, the present embodiment is not limited to this, and it can also be applied to an image pickup apparatus (an image pickup system) integrally configured by the lens apparatus and the image pickup apparatus body.

The drive lens 22 constituting the lens unit 21 is for example a focus lens for an autofocus, which is capable of being displaced in an X direction that is a direction of an optical axis OA (an optical axis direction). The drive lens 22 may also be other lenses such as a zoom lens. A movable portion 10 (a member to which a scale is attached) of the displacement detection apparatus in each of the embodiments described above is coupled to an actuator (not shown) that drives the drive lens 22. When the movable portion 10 is driven in the optical axis direction by the actuator or by hand, the scale 2 is displaced relative to the sensor unit 23. Along with this movement, the drive lens 22 is driven in the X direction (an arrow direction) that is the optical axis direction. A signal (an encoder signal) depending on the displacement of the drive lens 22 obtained from the sensor unit 23 of the displacement detection apparatus (the encoder) is outputted to the CPU 24. The CPU 24 generates a drive signal to move the drive lens 22 to a desired position, and the drive lens 22 is driven based on the drive signal.

Commonly, in many cases, the relative relation of the Y positions between the sensor unit and the scale may be displaced from an optimum position according to a mechanical accuracy or an assembling accuracy of parts of the sensor unit and the scale used in the displacement detection apparatus. When the movable part 10 is driven in the measurement direction (in the X direction), it may also be slightly displaced in the Y direction perpendicular to the measurement direction due to a mechanical backlash component caused by the assembling accuracy and the like. Therefore, when the displacement detection apparatus uses a scale having a single track configuration, a position of the pattern of the scale may be displaced from an original position that is to be read and thus a region where no pattern is formed may be read. As a result, there is a possibility that correct position information of the X direction cannot be obtained.

When the relative Y position between the sensor unit and the scale is displaced (moved) using a scale having a plurality of tracks in the displacement detection apparatus, a crosstalk in which a signal from a track other than an original track to be detected enters a light receiving portion may be generated. In this case, there is also a possibility that correction position information of the X direction cannot be detected. Therefore, it is important to control the position of the scale relative to the sensor unit in the Y direction.

According to the displacement detection apparatus and the lens apparatus (the image pickup apparatus) in each of the embodiments, relative position information between the sensor unit and the scale in the direction perpendicular to the measurement direction can be uniquely determined in a simple and small-size configuration. Thus, a highly accurate position adjustment can be performed at the time of assembling the displacement detection apparatus or the lens apparatus (the image pickup apparatus), and also the accuracy of the parts and the assembling accuracy can be controlled. As a result, a rate of good displacement detection apparatuses after the assembly is improved, and the cost required for the parts or the assembly can be reduced.

Since the relative position displacement in the direction perpendicular to the measurement direction, which is generated by the scale driven after assembling the displacement detection apparatus, can be detected, an alignment error signal can be outputted based on this position displacement. Thus, since the reading position of the scale is not displaced from the original position to be detected by controlling the relative position relation between the sensor unit and the scale in the Y direction, a highly accurate displacement detection apparatus can be configured.

As described above, according to each of the embodiments, in the displacement detection apparatus which includes the sensor unit and the scale detecting the position information, there is no need to prepare a light beam shaping unit, a light shielding member, a dedicated light receiving portion, and the like. Therefore, the relative position information between the sensor unit and the scale in the direction perpendicular to the measurement direction can be uniquely determined in a simple and small-size configuration. In this case, since the phase information in the measurement direction is not influenced, a displacement detection apparatus capable of performing the position detection in the measurement direction with high accuracy can be provided.

The displacement detection apparatus in each of the embodiments can also be applied to various kinds of apparatuses other than the lens apparatus or the image pickup apparatus. For example, the displacement detection apparatus of each embodiment is provided in an assembling apparatus (an assembling unit) that is configured by a robot arm and a conveyer that conveys an object to be assembled, and thus the position of the conveyer can be detected with high accuracy. As a result, according to each embodiment, small-sized and highly-accurate scale, displacement detection apparatus, lens apparatus, image pickup system, and assembling apparatus can be provided at low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

In each embodiment, each of the plurality of pattern portions arrayed in the direction perpendicular to the measurement direction has a rectangular shape, but the embodiment is not limited to this configuration. For example, each of the plurality of pattern portions may be configured so that widths in the measurement direction and in the direction perpendicular to the measurement direction change depending on a location (for example, a pattern portion having a rhombus or a triangle). In this case, for the plurality of pattern portions, maximum values of the widths in the measurement direction are equal to each other, and maximum values of the widths in the direction perpendicular to the measurement direction are different from each other, and thus the same effect as that of each embodiment can be obtained.

In each embodiment, the scale pattern is configured so that the widths of the plurality of pattern portions arrayed in the direction perpendicular to the measurement direction are changed, but the embodiment is not limited to this configuration. For example, the physical property of the scale pattern can also be gradually changed in the direction perpendicular to the measurement direction, i.e. the physical property can be configured as a gradation that changes continuously and gently.

This application claims the benefit of Japanese Patent Application No. 2012-286465, filed on Dec. 28, 2012, which is hereby incorporated by reference herein in its entirety.

What is claimed is:

1. A scale usable in a displacement detection apparatus for detecting a position of an object, the scale comprising:
a pattern periodically formed in a measurement direction and configured to change a physical property in a direction perpendicular to the measurement direction without changing phase information in the measurement direction when a detector reading the pattern moves relative to the pattern in the direction perpendicular to the measurement direction,
wherein the physical property of the pattern is uniquely determined with respect to a position in the direction perpendicular to the measurement direction,
wherein the pattern includes a plurality of pattern portions arrayed in the direction perpendicular to the measurement direction,
wherein the plurality of pattern portions arrayed in the direction perpendicular to the measurement direction have maximum values of a width in the measurement direction that are equal to each other and have maximum values of a width in the direction perpendicular to the measurement direction are different from each other, and
wherein the relative position between the scale and the detector in the direction perpendicular to the measurement direction is uniquely determinable.

2. The scale according to claim 1, wherein:
the pattern includes a first pattern formed with a first period in the measurement direction and a second pattern formed with a second period in the measurement direction,
the first pattern includes a plurality of first pattern portions arrayed in the direction perpendicular to the measurement direction,
the second pattern includes a plurality of second pattern portions arrayed in the direction perpendicular to the measurement direction,
each of the plurality of first pattern portions and each of the plurality of second pattern portions are arrayed alternately in the direction perpendicular to the measurement direction,
each of the plurality of first pattern portions changes so that a maximum value of a width in the direction perpendicular to the measurement direction increases toward a first direction of the direction perpendicular to the measurement direction, and
each of the plurality of second pattern portions changes so that a maximum value of a width in the direction perpendicular to the measurement direction increases toward a second direction opposite to the first direction.

3. The scale according to claim 2, wherein an average value of the physical property within a detection range of the position of the object is constant independently of a position in the direction perpendicular to the measurement direction.

4. The scale according to claim 1, wherein the pattern is configured so that the physical property gradually changes in the direction perpendicular to the measurement direction.

5. The scale according to claim 1, wherein the physical property is a reflectance distribution.

6. The scale according to claim 1, wherein the physical property is a magnetic strength distribution.

7. A displacement detection apparatus for detecting a position of an object, the displacement detection apparatus comprising:
a scale having a pattern periodically formed in a measurement direction;
a detector configured to be movable relative to the scale; and
a signal processor configured to process an output signal of the detector to obtain position information of the object,
wherein the pattern is configured to change a physical property in a direction perpendicular to the measurement direction without changing phase information in the measurement direction when the scale and the detector move relative to each other in the direction perpendicular to the measurement direction,
wherein the physical property of the pattern is uniquely determined with respect to a position in the direction perpendicular to the measurement direction,
wherein the pattern includes a plurality of pattern portions arrayed in the direction perpendicular to the measurement direction,
wherein the plurality of pattern portions arrayed in the direction perpendicular to the measurement direction have maximum values of a width in the measurement direction that are equal to each other and have maximum values of a width in the direction perpendicular to the measurement direction are different from each other, and
wherein the relative position between the scale and the detector in the direction perpendicular to the measurement direction is uniquely determinable.

8. The displacement detection apparatus according to claim 7, wherein the displacement detection apparatus is an absolute-type displacement detection apparatus.

9. A lens apparatus comprising:
a lens displaceable in an optical axis direction; and
a displacement detection apparatus configured to detect a position of an object, the displacement detection apparatus comprising:
a scale having a pattern periodically formed in a measurement direction;

a detector configured to be movable relative to the scale; and a signal processor configured to process an output signal of the detector to obtain position information of the object, wherein the pattern is configured so as to change a physical property in a direction perpendicular to the measurement direction without changing phase information in the measurement direction when the scale and the detector move relative to each other in the direction perpendicular to the measurement direction, the displacement apparatus being configured to detect a displacement of the lens.

10. The lens apparatus according to claim 9, wherein:

the physical property of the pattern is uniquely determined with respect to a position in the direction perpendicular to the measurement direction, the pattern includes a plurality of pattern portions arrayed in the direction perpendicular to the measurement direction, the plurality of pattern portions arrayed in the direction perpendicular to the measurement direction have maximum values of a width in the measurement direction that are equal to each other and have maximum values of a width in the direction perpendicular to the measurement direction are different from each other, and the relative position between the scale and the detector in the direction perpendicular to the measurement direction is uniquely determinable.

11. An image pickup system comprising:

a lens apparatus comprising:
  a lens displaceable in an optical axis direction; and
  a displacement detection apparatus configured to detect a position of an object, the displacement detection apparatus comprising:
    a scale having a pattern periodically formed in a measurement direction;
    a detector configured to be movable relative to the scale; and
    a signal processor configured to process an output signal of the detector to obtain position information of the object,
    wherein the pattern is configured to change a physical property in a direction perpendicular to the measurement direction without changing phase information in the measurement direction when the scale and the detector move relative to each other in the direction perpendicular to the measurement direction, the displacement apparatus being configured to detect a displacement of the lens; and an image pickup apparatus including an image pickup element configured to perform a photoelectric conversion of an optical image via the lens.

12. The image pickup system according to claim 11, wherein:

the physical property of the pattern is uniquely determined with respect to a position in the direction perpendicular to the measurement direction, the pattern includes a plurality of pattern portions arrayed in the direction perpendicular to the measurement direction, the plurality of pattern portions arrayed in the direction perpendicular to the measurement direction have maximum values of a width in the measurement direction that are equal to each other and have maximum values of a width in the direction perpendicular to the measurement direction are different from each other, and the relative position between the scale and detector in the direction perpendicular to the measurement direction is uniquely determinable.

13. An assembling apparatus comprising:

an assembling unit including a robot arm and a conveyer configured to convey an object to be assembled; and a displacement detection apparatus configured to detect a position of an object, the displacement detection apparatus comprising:
  a scale having a pattern periodically formed in a measurement direction;
  a detector configured to be movable relative to the scale; and
  a signal processor configured to process an output signal of the detector to obtain position information of the object,
  wherein the pattern is configured to change a physical property in a direction perpendicular to the measurement direction without changing phase information in the measurement direction when the scale and the detector move relative to each other in the direction perpendicular to the measurement direction, the displacement detection apparatus being configured to detect a position of the conveyer.

14. The assembling apparatus according to claim 13, wherein:

the physical property of the pattern is uniquely determined with respect to a position in the direction perpendicular to the measurement direction, the pattern includes a plurality of pattern portions arrayed in the direction perpendicular to the measurement direction, the plurality of pattern portions arrayed in the direction perpendicular to the measurement direction have maximum values of a width in the measurement direction that are equal to each other and have maximum values of a width in the direction perpendicular to the measurement direction are different from each other, and the relative position between the scale and detector in the direction perpendicular to the measurement direction is uniquely determinable.

15. A method for a displacement detection apparatus configured to detect a position of an object, the displacement detection apparatus comprising a scale having a pattern periodically formed in a measurement direction and a detector configured to be movable relative to the scale, the method comprising:

a processing step of processing an output signal of the detector to obtain position information of the object, wherein the pattern is configured to change a physical property in a direction perpendicular to the measurement direction without changing phase information in the measurement direction when the scale and the detector moves relative to each other in the direction perpendicular to the measurement direction, wherein the physical property of the pattern is uniquely determined with respect to a position in the direction perpendicular to the measurement direction, wherein the pattern includes a plurality of pattern portions arrayed in the direction perpendicular to the measurement direction, wherein the plurality of pattern portions arrayed in the direction perpendicular to the measurement direction have maximum values of a width in the measurement direction that are equal to each other and have maximum values of a width in the direction perpendicular to the measurement direction are different from each other, and wherein the relative position between the scale and the detector in the direction perpendicular to the measurement direction is uniquely determinable.

* * * * *